United States Patent
Schneemeyer et al.

[11] Patent Number: 5,912,797
[45] Date of Patent: Jun. 15, 1999

[54] DIELECTRIC MATERIALS OF AMORPHOUS COMPOSITIONS AND DEVICES EMPLOYING SAME

[75] Inventors: Lynn Frances Schneemeyer, Westfield; Robert Bruce van Dover, Maplewood, both of N.J.

[73] Assignee: Lucent Technologies Inc., Murray Hill, N.J.

[21] Appl. No.: 08/936,132

[22] Filed: Sep. 24, 1997

[51] Int. Cl.⁶ .................................................. H01G 4/06
[52] U.S. Cl. ........................ 361/311; 361/321.4; 501/134
[58] Field of Search ............... 501/134; 361/311, 361/312, 313, 321.1, 321.2, 321.3, 321.4, 321.5, 322, 327; 310/306, 311; 252/62.9 PZ

[56] References Cited

U.S. PATENT DOCUMENTS 5,555,219  9/1996  Akiyama et al. .................... 359/103
5,610,853  3/1997  Akiyama et al. .................... 365/145
5,644,184  7/1997  Kucherov ............................. 310/306

*Primary Examiner*—Kristine Kincaid
*Assistant Examiner*—Anthony Dinkins
*Attorney, Agent, or Firm*—Mathews, Collins, Shepherd & Gould, P.A.

[57] ABSTRACT

A thin dielectric film that uses an amorphous composition of R—Sn—Ti—O as the main component is disclosed, wherein R is Zr or Hf, having particular application for use in a capacitor of a DRAM cell. The preferable range of the dielectric thin film composition is centered around $Zr_xSn_yTi_zO_w$, where $0.1 \leq x \leq 1.8$; $0.1 \leq y \leq 1.6$; $0.2 \leq z \leq 1.9$; and $2.0 \leq w \leq 4.0$; and $x+y+z=2$. Preferably, x is about 0.2, y is about 0.2, and z is about 0.6. Doping of the composition with nitrogen is further disclosed as improving the dielectric properties and uniformity of the film.

12 Claims, 3 Drawing Sheets

DIELECTRIC MATERIALS OF AMORPHOUS COMPOSITIONS AND DEVICES EMPLOYING SAME

FIELD OF THE INVENTION

The invention relates to dielectric materials comprising thin, amorphous films of R—Sn—Ti—O, where R is selected from the group consisting of Zr and Hf. The invention has particular application for use in a capacitor of a dynamic random access memory (DRAM) device.

BACKGROUND OF THE INVENTION

Materials having high dielectric constants have been researched for use as dielectric layers for thin film capacitors. As microelectronic circuits become increasingly integrated, the demand for smaller components becomes stronger. The quest for miniaturization is particulary ardent with regard to DRAM cell designs and devices. The migration of integrated circuits to smaller feature sizes is driving interest in developing thin film dielectrics having a dielectric constant ($\epsilon$) greater than that of previously used materials. For example, typically films of a-$SiO_x$ have been used as a dielectric material in DRAM capacitors or capacitors of integrated-circuit devices. As the cell size has shrunk, designers have resorted to use of extremely thin a-$SiO_x$ films, but such films exhibit a decreased reliability due to their finite breakdown fields. Thus, efforts have been directed toward developing new dielectric materials. The inherent limitations of a-$SiO_x$ films may be avoided by substituting a material having a higher dielectric constant and comparable breakdown field.

Attention has been focused on materials with high values of $\epsilon$ and figure of merit, he figure of merit being the multiple of the dielectric constant ($\epsilon$) and breakdown field ($E_{br}$) of a material. In other words, the dielectric constant ($\epsilon$) times the breakdown field ($E_{br}$) [MV/cm] equals its figure of merit ($\epsilon E_{br}$) [$\mu C/cm^2$]. The figure of merit is a useful unit of measure of the efficacy of a dielectric material, as it is not dependent upon film thickness.

In any case, use of a-$Ta_2O_5$ (amorphous tantalum pentoxide), a-$TiO_x$, and crystalline x-$(Ba,Sr)TiO_3$, as dielectric materials has received particular attention. Each of these materials offers advantages and disadvantages. For example, the relatively high dielectric constant and large figure of merit for a-$TaO_x$ films have made them of particular interest. However, it is desirable to have dielectric films for use in integrated circuits with even higher dielectric constants (and breakdown fields), which has spurred interest in materials such as a-$TiO_x$ and x-$(Ba,Sr)TiO_3$. On the other hand, while a-$Ta_2O_5$ and a-$TiO_x$ incorporate elements that are generally considered compatible with integrated circuit fabrication, Ba and Sr are more problematic. Thus, a material having a high dielectric constant and compatibility with silicon-chip integrated circuit fabrication would be useful.

Accordingly, there is a need for a dielectric material for use in an integrated circuit device equipped with a capacitor having high dielectric constants, large breakdown fields, and compatibility with silicon-chip integrated circuit fabrication. Applicants have discovered that thin amorphous films of R—Sn—Ti—O are useful for this purpose, where R is selected from the group consisting of zirconium (Zr) and hafnium (Hf).

Zr—Ti—Sn—O ceramics—in crystalline or polycrystalline form—previously have been reported as useful for their microwave properties, including a moderate dielectric constant and low temperature coefficient of permittivity. However, the compositions previously studied are typical of those used in such applications, that is, they invariably fall within a homogeneous phase field. Thin films of $(Zr,Sn)TiO_4$ have been reported as useful as components of dielectrics for capacitors of hybrid integrated circuits. See O. Nakagawara, Y. Toyoda, M. Kobayashi, Y. Yoshino, Y. Katayama, H. Tabata, and T. Kawai, "Electrical Properties of $(Zr,Sn)TiO_4$ Dielectric Thin Film Prepared by Pulsed Laser Deposition," J. APPL. PHYS. 80, 388 (1996) ("Nakagawara"). However, Nakagawara reports a relative decrease in the dielectric constant for amorphous films, attributing this decrease to a decrease in the ionic polarizability of the materials. The films reported by Nakagawara are structurally close to crystalline x-$(Zr, Sn)TiO_4$, following prior art teachings directed toward compositions falling within homogeneous crystalline phase fields, and they report films having dielectric constants of about $\epsilon=22$.

Applicants have discovered, however, that materials having an amorphous composition of zirconium-tin-titanium-oxide or hafnium-tin-titanium-oxide, falling outside the homogeneous crystalline phase fields typically considered optimum, are advantageous as thin dielectric materials so that the area of the capacitor can be substantially reduced. Applicants have further discovered as preferred dielectric materials of the composition $(Zr_{.2}Sn_{.2}Ti_{.6})_2O_xN_y$ having a dielectric constant of about 61 and a breakdown field of 4.1 MV/cm, when deposited on a substrate held at 200 degrees Centigrade. This reflects a figure of merit $\epsilon E_{br}=22.1~\mu C/cm^2$, which is about threefold higher than that of the best a-$TaO_x$ films and about sevenfold higher than that of high-quality deposited a-$SiO_x$ films. Additionally, the films disclosed herein are relatively stable and survive conventional back-end processing steps used in silicon integrated-circuit fabrication.

SUMMARY OF THE INVENTION

The invention relates to a thin dielectric film that uses an amorphous composition of R—Sn—Ti—O as the main component, where R may be selected from the group consisting of zirconium (Zr) and hafnium (Hf). The preferable range of the dielectric thin film composition is centered around $R_xSn_yTi_zO_w$, where $0.1 \leq x \leq 1.8$; $0.1 \leq y \leq 1.6$; $0.2 \leq z \leq 1.9$; and $2.0 \leq w \leq 4.0$, and wherein $x+y+z=2$. Preferably, x is about 0.4, y is about 0.4, z is about 1.2, and w is about 4.0. The invention further relates to the amorphous composition doped with nitrogen for improving the dielectric properties and uniformity of the film. Also claimed is a capacitor comprising the subject dielectric materials disposed between two electrodes.

BRIEF DESCRIPTION OF THE DRAWINGS

For a better understanding of the invention, an exemplary embodiment is described below, considered together with the accompanying drawings, in which.

It is to be understood that these drawings are for the purposes of illustrating the concepts of the invention and are not to scale.

DETAILED DESCRIPTION OF THE INVENTION

The thin dielectric film obtained according to this invention is made of an amorphous composition of R—Sn—Ti—O, wherein R is Zr or Hf, having a high dielectric constant $\epsilon$ (i.e., above 30), so that when used in a capacitor, the area of the capacitor can be reduced. The discussion below is divided into three parts. In Part A, an application of this invention is described with reference to use of the dielectric material in a DRAM capacitor. In Part B, preferred compositions for the dielectric material are described. Lastly, in Part C, methods for depositing the dielectric film of the invention on a substrate are described.

A. APPLICATION EXAMPLE

Figure 1:
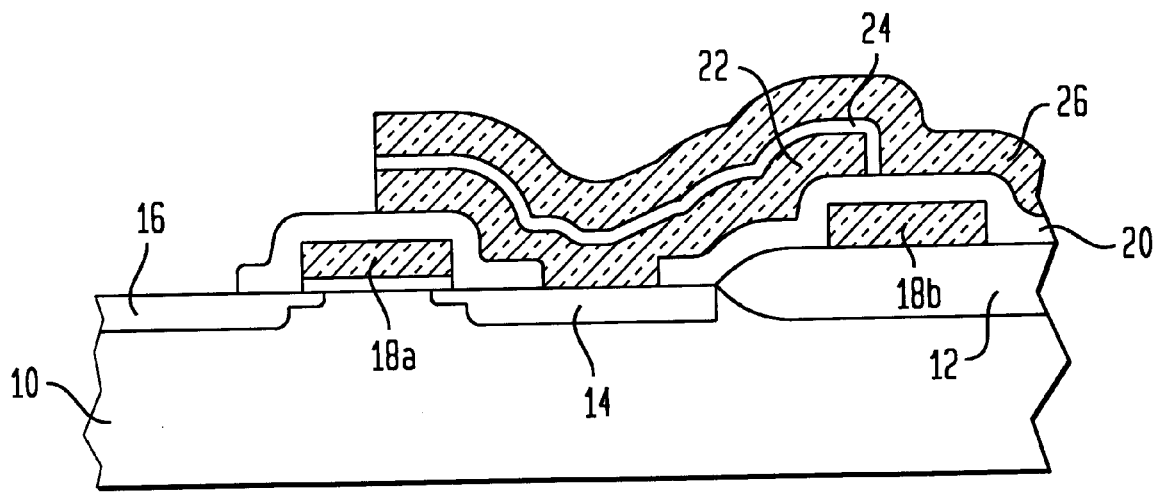
FIG. 1 is a schematic cross-section illustrating one embodiment of a DRAM cell design comprising a dielectric layer according to this invention.

By way of illustration, FIG. 1 shows a cross-section of a typical stacked capacitor DRAM design incorporating the dielectric layer of this invention; however, it is to be understood that the invention is not limited to use with DRAM cells, but may be used in other applications as well, such as hybrid integrated circuits or capacitors of other devices.

The most common cell design used in DRAM applications involves a transfer gate (e.g., an MOS field-effect transistor or MOSFET), and a storage node consisting of a capacitor. Referring to FIG. 1, the substrate 10, comprised typically of silicon, contains source 14 and drain 16 diffusions for the MOFSET, as well as MOFSET gate structures 18a, 18b. The substrate 10 will have disposed on its surface a field oxide pattern (or FOX) 12. The capacitor is disposed on the silicon substrate 10, comprising a bottom electrode 22 and top electrode 26, separated by a thin film of a dielectric material 24. The electrodes 22, 26 may be comprised of thin films of Ti, TiN, Al, Al doped with 0.5% Cu, or other materials known in the art for forming electrodes for DRAM applications. The dielectric film 24 fills the space between the bottom electrode 22 and top electrode 26, and is comprised of Zr—Sn—Ti—O or Hf—Sn—Ti—O, which also may be doped with nitrogen. The bottom electrode 22 and top electrode 26, together the thin dielectric film 24 sandwiched between them, form a capacitor. An insulating layer 20 may separate the capacitor from the gate structures 18a, 18b.

B. PREFERRED COMPOSITIONS

Figure 2:
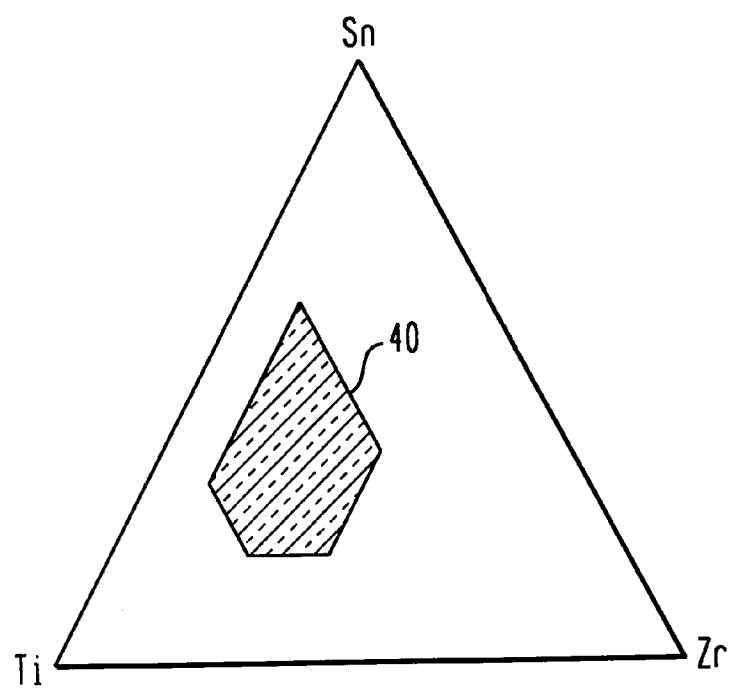
FIG. 2 is a schematic composition diagram for the Zr—Sn—Ti—O system according to this invention, showing the region of preferred compositions.

The essential trends for the figure of merit as a function of composition in the Zr—Sn—Ti—O system (without doping with N), are shown schematically in FIG. 2 in the area 40 shaded with diagonal hatching. This area 40 reflects an amorphous thin film region that is outside the single phase polycrystalline region. The preferred composition range, as shown in FIG. 2, reflects the amorphous material $Zr_xSn_yTi_zO_w$, in which x, y, and z, are as follows:

0.2≤x≤0.7 (Zr)

0.35≤y≤1.2 (Sn)

0.6≤z≤1.2 (Ti), where x, y and z=2

Additionally, dielectric materials with a useful figure of merit (i.e., over the relaxed criterion 3.0 $\mu C/cm^2$) can be obtained in the Zr—Sn—Ti—O system over a much larger composition region, within the boundaries:

0.1≤x≤1.8 (Zr)

0.1≤y≤1.6 (Sn)

0.2≤z≤1.8 (Ti)

where x, y and z=2

Figure 3:
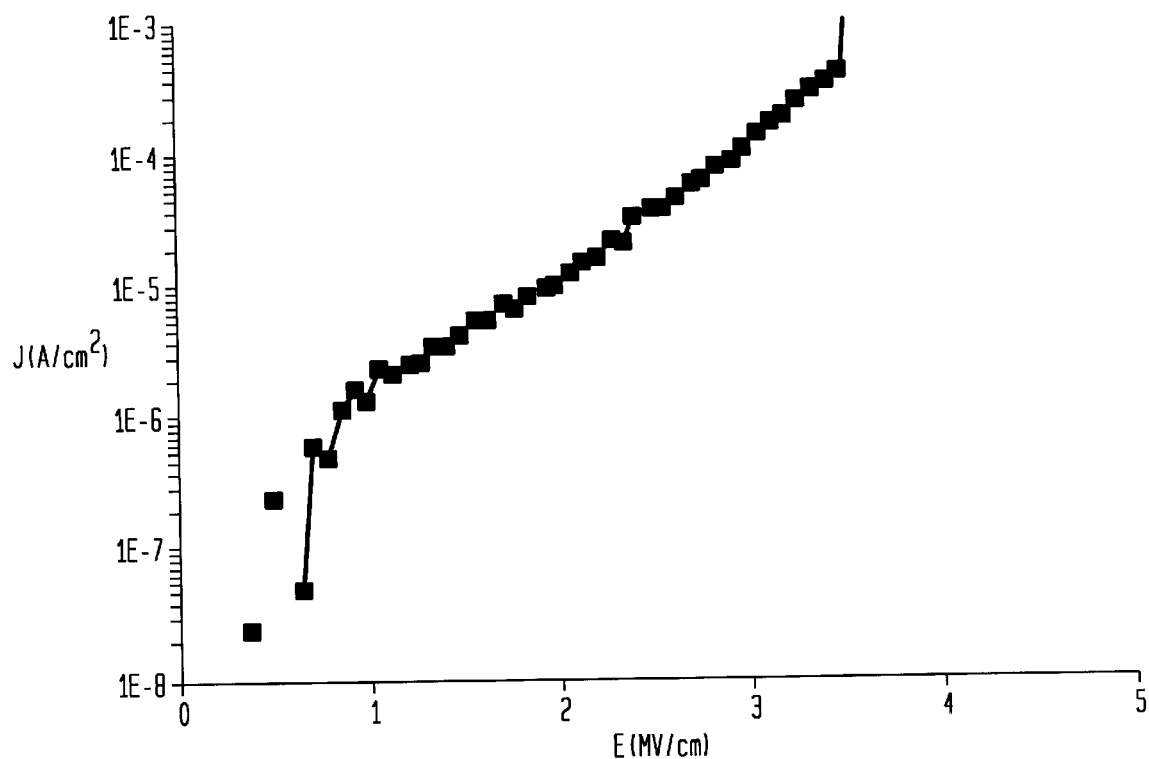
FIG. 3 is a table showing typical current-voltage characteristics for a capacitor formed according to this invention and with the compositions shown in FIG. 2.

FIG. 3 shows the current-voltage characteristics for a capacitor formed on the region of the film with the approximate composition of $Zr_{0.3}Sn_{0.8}Ti_{0.9}O_2$ (within the above preferred range), plotting the current density versus electric field. The dielectric constant of this film measured at 200 degrees Centigrade was $\epsilon$=55, because the Ti fraction was relatively low. The figure of merit for this particular capacitor was 16.9 $\mu C/cm^2$.

Figure 4:
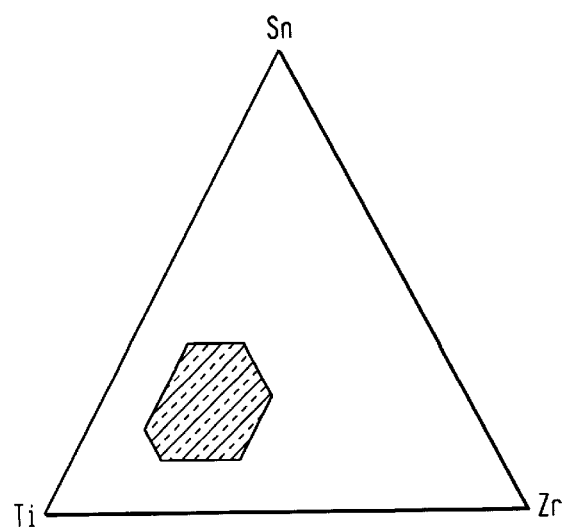
FIG. 4 is a schematic composition diagram for the Zr—Sn—Ti—O—N system according to this invention, showing the region of preferred compositions.

The essential trends for the figure of merit as a function of composition in the Zr—Sn—Ti—O—N system (involving doping with nitrogen), are shown schematically in FIG. 4 in the area 42 shaded with diagonal hatching. Again, this area 42 reflects an amorphous thin film region that is outside the single phase polycrystalline region. The preferred composition range, as shown in FIG. 4, reflects the amorphous material $Zr_xSn_yTi_zO_wN_v$, in which x, y, and z, are as follows:

0.25≤x≤0.7 (Zr)

0.25≤y≤0.7 (Sn)

1.0≤z≤1.4 (Ti), where x, y and z=2

The best properties are found in the region centered around the composition $Zr_{0.4}Sn_{0.4}Ti_{1.2}O_wN_v$, where w is approximately 4.0 and v is about 0.02. However, dielectric materials with a useful figure of merit (i.e., over the relaxed criterion 3.0 $\mu C/cm^2$) can be obtained in the Zr—Sn—Ti—O—N system over a much larger composition region, within the boundaries:

0.1≤x≤1.8 (Zr)

0.1≤y≤1.4 (Sn)

0.2≤z≤1.9 (Ti), where x, y and z=2

Figure 5:
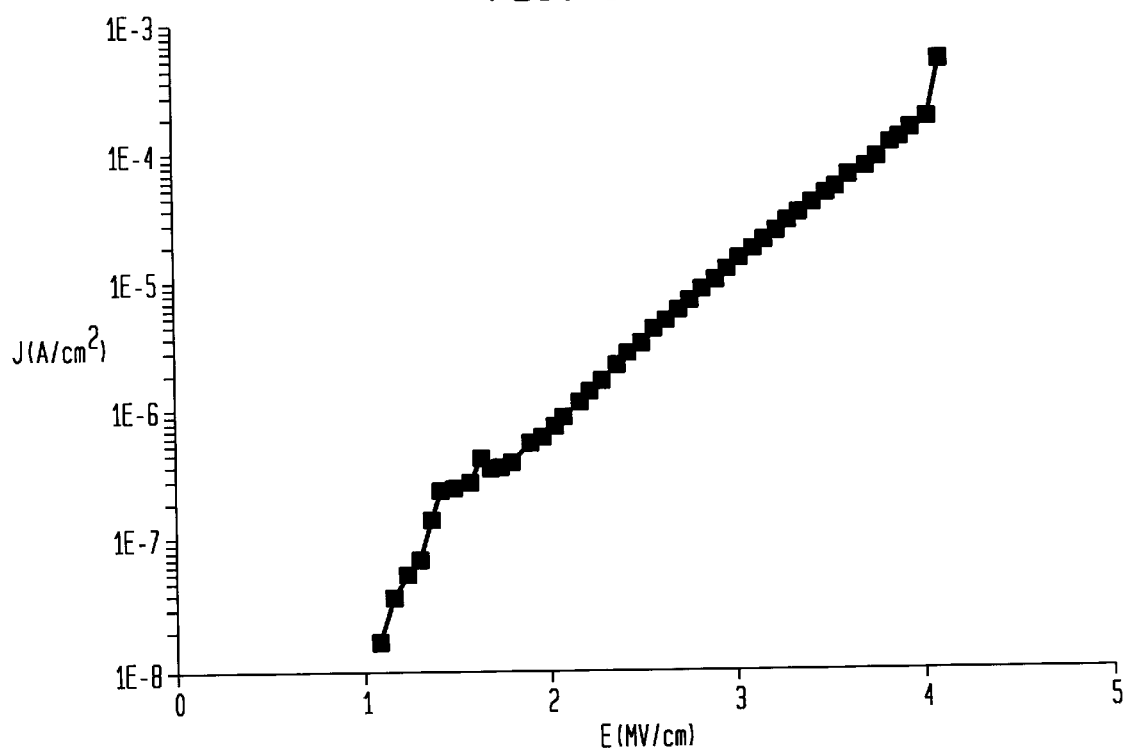
FIG. 5 is a table showing typical current-voltage characteristics for a capacitor formed according to this invention and with the compositions shown in FIG. 4.

FIG. 5 shows the current-voltage characteristics for a capacitor formed on the region of the film with the approximate composition of $Zr_{0.4}Sn_{0.4}Ti_{1.2}O_wN_v$ (within the preferred range illustrated in FIG. 4), plotting the current density versus electric field. The dielectric constant of this film measured at 200 degrees Centigrade was $\epsilon$=62.2. The figure of merit for this particular capacitor was 22.6 $\mu C/cm^2$. Although preferred compositions are described above with particular reference to zirconium, it is understood that according to the invention, Hf may be substituted for Zr as well within the same given parameters.

C. SAMPLE PREPARATION

Films may be prepared by either off-axis or on-axis reactive sputtering. An apparatus useful for depositing films via radio frequency reactive sputtering is shown in FIG. 6.

The apparatus and process will now be described with reference to depositing a composition of Zr—Ti—Sn—O, with and without doping by nitrogen, although it is understood that the same process may be employed to deposit a film of Hf—Ti—Sn—O, by using an Hf target gun in place of the Zr gun described below.

Figure 6:
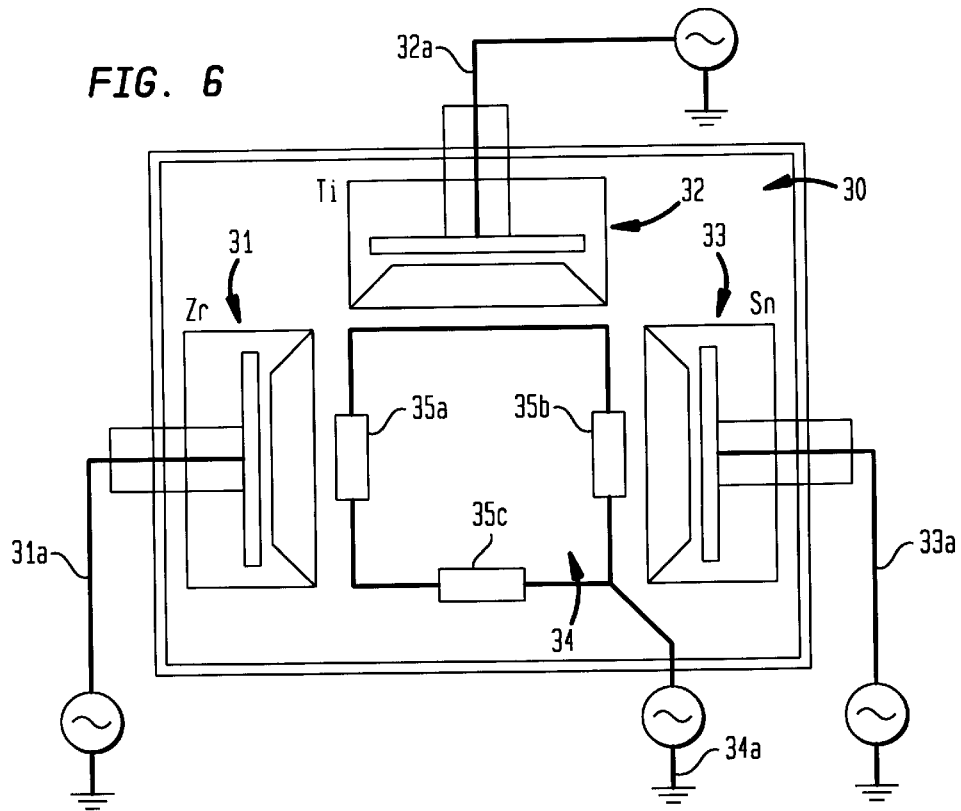
FIG. 6 is a top view schematic representation of a three-gun radio-frequency sputtering system that may be used in forming the thin dielectric film according to this invention.

Referring to FIG. 6, the apparatus comprises a vacuum chamber 30, having planar magnetron sputter guns 31, 32, and 33. The guns 31, 32, and 33 advantageously have two-inch diameter targets and are arranged in a facing-targets configuration (i.e., toward the substrate to be coated 34), for depositing Zr, Ti, and Sn, respectively. The targets are disposed approximately two centimeters from opposite ends of the substrate, which typically has a rectangular shape. The sputter guns each are connected to an RF power source (31a, 32a, and 33a), and allowed to self-bias. The guns advantageously may be run at 150 W (for the Zr gun 31), 75 W (for the Ti gun 32), and 20 W (for the Sn gun 33), to provide an appropriate Zr—Ti—Sn—O composition at the substrate midpoint. Depositions may be performed with a total pressure of 30 mTorr for off-axis sputtering and 4.0 mTorr for on-axis sputtering, using various flow rates, as will be further described below.

A substrate 34 used for deposition of the thin dielectric films typically comprise silicon wafers coated with about 5500 Angstroms thermal oxide, 450 Angstroms Ti, and 600 Angstroms TiN. Prior to the deposition process, the substrate 34 may be mounted to a thick aluminum substrate holder (hidden from view in FIG. 6), using tantalum spring clips 35a, 35b, and 35c. The substrate 34 may be connected to a power source 34a, for providing RF power (preferably about 10 W), during the deposition process to promote the surface mobility on the film. The substrate holder (not shown), may be heated using a tantalum-wire radiant heater and monitored with a chromel/alumel thermocouple inserted into the substrate holder. Preferably, the temperature should remain constant during the deposition process.

For off-axis sputtering deposition of a composition of Zr—Ti—Sn—O, such as that reflected in FIG. 2 hereof, the following steps may be employed. First, the substrate 34 is provided, coated as previously described or with about 60 nm of TiN. The substrate is mounted onto the substrate holder using the Tantalum-clips 35a, 35b, and 35c, and disposed so that the substrate is about 6 centimeters from the Zr sputter gun target 31, 4 centimeters from the Ti sputter gun target 32, and 6.5 centimeters from the Sn sputter gun target 33. Preferably, the sputter guns 31, 32, and 33 are positioned along the same horizontal plane and arranged with their targets facing inward and at 90 degree angles relative to each other, as shown in FIG. 6. The substrate 34 is positioned so that its top surface is disposed parallel to the horizontal plane of the targets, but disposed about 3.5 centimeters below the plane of the targets.

Once the substrate 34 is appropriately positioned within the vacuum chamber 30, the deposition process may be carried out. The background pressure within the vacuum chamber should be pumped to an approximate pressure of lower than $5 \times 10^{-6}$ Torr. The temperature of the substrate 34 should be raised to about 200 degrees Centigrade, maintained within ten or twenty degrees. The oxygen ($O_2$) gas is then introduced, along with Argon gas, at 10 sccm and 15 sccm, respectively (wherein "sccm" refers to standard cubic centimeters per minute, i.e., at standard pressure and temperature). The pressure of the sputtering gas should be raised to about 30.0 mTorr. The RF power sources 34a, 31a, 32a, and 33a are then activated to apply RF power to the substrate 34 and sputtering guns 31, 32, and 33, at 10 W, 75 W, 150 W, and 20 W, respectively, as previously described. RF matching circuits may be tuned for each RF power supply 31a, 32a, 33a, and 34a, to obtain the minimum reflected power. The sputtered deposition should be run for about twenty minutes, and then the RF power and gas supplies turned off. The system may then be vented and the sample retrieved.

To obtain a dielectric film doped with nitrogen, the same process may be used, except that nitrogen gas would need to be pumped into the vacuum chamber along with the oxygen and argon gas. In this case, gas flow rates of about 5 sccm $N_2$ gas, 10 sccm $O_2$ gas, and 10 sccm Ar gas may advantageously be used.

An on-axis sputtering deposition process, involving one composite sputtering gun, also is advantageous and reduces the process time. For this application, a composite Zr—Sn—Ti metal target is used, having a composition of 60% Ti, 20% Zr, and 20% Sn (in atomic %), suitable for a two-inch diameter sputter gun. Following the process for the off-axis deposition, the substrate is mounted onto a substrate holder and held in place using Ta-clips for thermal contact. The substrate should be positioned about 3.0 centimeters from the composite metal target, with its surface oriented parallel with and centered with respect to the target. The parameters for the background pressure gas, the temperature substrate, and rate of gas flow are the same as for off-axis deposition, described above (i.e., background gas pressure is pumped to lower than $5 \times 10^{-6}$ Torr; the temperature of the substrate is maintained at about 200 degrees Centigrade, and gases are introduced at 10 sccm for $O_2$ gas and 15 sccm for Ar gas). The pressure of the sputtering gas may be raised, however, to about 4.0 mTorr. The RF power applied to the composite sputtering gun may be about 100 W, tuned with an RF matching circuit to obtain the minimum reflected power. The sputtered deposition can be run for five minutes, and then the RF power and gas supplies turned off. Once the substrate has cooled to about 100 degrees Centigrade, the system may then be vented and the sample retrieved.

It is advantageous to perform depositions at the temperature of about 200 degrees Centigrade, with a relatively high partial pressure of oxygen and with some nitrogen added. It is believed the nitrogen acts to compensate traps created by oxygen vacancies, to provide a more uniform dielectric material. Doping with other compensating cations or anions may be used as well. The density of oxygen vacancies or traps also may be compensated through other processing parameters, such as oxygen pressure, substrate temperature, total pressure, target configuration, substrate bias, and the like.

It will be understood that the embodiments described herein are merely exemplary and that a person skilled in the art may make variations and modifications without departing from the spirit and scope of the invention. The hybrid integrated circuit of this invention should not be limited to the examples or method of preparation described above. For example, to form the thin dielectric film of the capacitor that has R—Sn—Ti—O as the main component (where R is Zr or Hf), instead of the radio frequency (RF) magnetron sputtering method described above, other methods may be used, such as ion beam sputtering, chemical vapor deposition, electron cyclotron resonance sputtering, or laser ablation. Additionally, it is contemplated that the films can be doped with small concentrations of appropriate elements to compensate for oxygen traps (e.g., Mg, Ca, Sr, Y, Al, or In). All such variations and modifications are intended to be included within the scope of the appended claims.

We claim:

1. A dielectric film comprising an amorphous composition of $R_xSn_yTi_zO_w$ as the main component, wherein R is selected from zirconium (Zr) and hafnium (Hf) and x, y, z, and w are approximately $0.1 \leq x \leq 1.8$; $0.1 \leq y \leq 1.6$; $0.2 \leq z \leq 1.9$; and $2.0 \leq w \leq 4.0$; and wherein $x+y+z=2$.

2. The dielectric film of claim 1, in which x is approximately 0.3, y is approximately 0.9, and z is approximately 0.8.

3. The dielectric film of claim 1, in which x is approximately 0.4, y is approximately 0.4, and z is approximately 1.2.

4. The dielectric film of claim 1, in which the dielectric constant $\epsilon$ of the composition measured at 10 kHz is greater than 60 when deposited on a substrate held at about 200 degrees Centigrade.

5. A dielectric film comprising an amorphous composition of R—Sn—Ti—O as the main component, wherein R is selected from zirconium (Zr) and hafnium (Hf) and the amorphous composition is doped with nitrogen.

6. The dielectric film of claim 5, in which the composition comprises $R_xSn_yTi_zO_wN_v$ in which x, y, z, w and v are approximately $0.1 \leq x \leq 1.8$; $0.1 \leq y \leq 1.6$; $0.2 \leq z \leq 1.9$; $2.0 \leq w \leq 4.0$; and $0.01 \leq v \leq 0.03$; and wherein $x+y+z=2$.

7. The dielectric film of claim 6, in which x is approximately 0.4, y is approximately 0.4, and z is approximately 1.2.

8. A capacitor comprising a pair of electrodes and disposed between the electrodes, a layer of dielectric material having a dielectric constant, the material comprising an amorphous composition of R—Sn—Ti—O as the main component, wherein R is selected from the group consisting of zirconium and hafnium and the amorphous composition has a dielectric constant ($\epsilon$) measured at 10 kHz of at least about 55 when deposited on a substrate held at about 200 degrees Centigrade.

9. The capacitor of claim 8, in which the amorphous composition comprises $R_xSn_yTi_zO_w$ as the main component, wherein x, y, z and w are approximately $0.1 \leq x \leq 1.8$; $0.1 \leq y \leq 1.6$; $0.2 \leq z \leq 1.9$; and $2.0 \leq w \leq 4.0$; and wherein $x+y+z=2$.

10. The capacitor of claim 9, in which the amorphous composition is further doped with nitrogen.

11. A dielectric film comprising an amorphous composition, the composition having a dielectric constant ($\epsilon$) and a figure of merit (FOM), the FOM being defined by the dielectric constant ($\epsilon$) of the composition multiplied by its breakdown field, in which the dielectric constant of the composition measured at 10 kHz is greater than 30 and the FOM is greater than $3.0 \ \mu C/cm^2$.

12. A dielectric film comprising an amorphous composition of $R_xSn_yTi_zO_w \ N_v$ as the main component, wherein R is selected from zirconium (Zr) and hafnium (Hf), and x, y, z, w, and v are approximately $0.1 \leq x \leq 1.8$; $0.1 \leq y \leq 1.6$; $0.2 \leq z \leq 1.9$, $2.0 \leq w \leq 4.0$; and $0.10 \leq v \leq 0.03$.

* * * * *